United States Patent [19]

Yamada

[11] Patent Number: 4,853,562
[45] Date of Patent: Aug. 1, 1989

[54] PROGRAMMABLE LOGIC ARRAY USING SINGLE TRANSISTOR TO GENERATE TRUE OR COMPLEMENT SIGNAL

[75] Inventor: Shitaka Yamada, Tokyo, Japan
[73] Assignee: NEC Corporation, Tokyo, Japan
[21] Appl. No.: 112,925
[22] Filed: Oct. 27, 1987

[30] Foreign Application Priority Data

Oct. 27, 1986 [JP] Japan ............................... 61-254984

[51] Int. Cl.$^4$ ......................................... H03K 19/177
[52] U.S. Cl. .................................... 307/465; 307/303; 307/468
[58] Field of Search ................ 307/465, 448, 468–469, 307/303; 364/716; 365/104

[56] References Cited

U.S. PATENT DOCUMENTS

| | | | |
|---|---|---|---|
| 4,350,992 | 9/1982 | Tubbs | 365/104 X |
| 4,384,345 | 5/1983 | Mikome | 365/104 |
| 4,409,499 | 10/1983 | Zapisek et al. | 364/716 X |
| 4,467,439 | 8/1984 | Rhodes | 307/465 X |

FOREIGN PATENT DOCUMENTS 8503161 7/1985 World Int. Prop. O. ........... 307/468

OTHER PUBLICATIONS

Kraft et al., "Method of Personalizing Programmed Logic Arrays Using Multiple Levels of Polysilicon", IBM T. D. B., vol. 23, No. 3, 8-1980, pp. 881–882.
Balasubramanian et al., "Program Logic Array With Metal Level Personalization", IBM T. D. B., vol. 19, No. 6, 11-1976, pp. 2144–2145.
Rideout, "Logic Arrays With Polysilicon Gate Lines", IBM T. D. B., vol. 19, No. 6, 11-1976, pp. 2262–2265.
Andres, "MOS Programmable Logic Arrays", Texas Instruments Application Report, 9-1974, pp. 1–4.

Primary Examiner—David Hudspeth
Attorney, Agent, or Firm—Sughure, Mion, Zinn, Macpeak & Seas

[57] ABSTRACT

For reduction in occupation area, there is provided a programmable logic array circuit fabricated on a semiconductor substrate comprising (a) a plurality of true signal lines arranged in rows, (b) a plurality of complementary signal lines each intervening between adjacent two of the true signal lines, (c) a plurality of product term lines arranged in columns, (d) a first source of constant voltage supplying a first constant voltage level to the product term lines, (e) a second source of constant voltage producing a second constant voltage level different from the first constant voltage level, and (f) a plurality of active device areas each located under that area defined by one of the true signal lines, one of the complementary signal lines adjacent to aforesaid one of the true signal lines and adjacent two of the product term lines, and each of the active device area has two field effect transistors gate electrodes of which can be connected to either of the true signal line and the complementary signal line, then each active device area is expected to provide source and drain regions for only two field effect transistors.

1 Claim, 5 Drawing Sheets

PRIOR-ART

PRIOR-ART

PRIOR-ART

PRIOR-ART

PROGRAMMABLE LOGIC ARRAY USING SINGLE TRANSISTOR TO GENERATE TRUE OR COMPLEMENT SIGNAL

FIELD OF THE INVENTION

This invention relates to a programmable logic array circuit and, more particularly, to a programmable logic array circuit capable of realizing a predetermined boolean function by forming a conductive layer during the fabrication process.

BACKGROUND OF THE INVENTION

A typical example of a known programmable logic array circuit is illustrated in FIGS. 1 and 2. The programmable logic array circuit illustrated in FIGS. 1 and 2 basically comprises an AND array 1, an OR array 2 and four product term lines 3, 4, 5 and 6. The AND array has six n-channel type MOS field effect transistors 7, 8, 9, 10, 11 and 12 and the OR array 2 has five n-channel type MOS field effect transistors 13, 14, 15, 16 and 17. The product term lines 3 to 6 are coupled in parallel to a source of positive voltage 20 through p-channel type MOS field effect transistors 21, 22, 23 and 24, respectively, and the p-channel type MOS field effect transistors 21 to 24 have respective gate electrodes coupled to the ground terminal so that the p-channel type MOS field effect transistors 21 to 24 serve as load transistors supplying a positive voltage level to the product term lines 3 to 6. The MOS field effect transistors 7 and 10 of the AND array 1 have respective source-drain paths between the product term line 3 and a ground terminal and respective gate electrodes coupled to input signal lines 18 and 19, respectively. The input signal lines 18 and 19 propagate input signals A and B, respectively, so that the product term line 3 has a product signal T1 of a high level only when both of the input signals A and B have respective low levels. Similarly, the MOS field effect transistors 9 and 11 have respective source-drain paths between the product term line 4 and the ground terminal and respective gate electrodes coupled to complementary signal lines 25 and 26, respectively. The complementary signal lines 25 and 26 propagate the inverses of the input signals A and B produced by inverter circuits 27 and 28, respectively, so that the product term line 4 has a product signal T2 of a high level only when both of the input signals A and B have respective high levels. On the other hand, the MOS field effect transistors 12 and 8 have respective source-drain paths between product term lines 5 and 6 and the ground terminal and respective gate electrodes coupled to the complementary signal line 26 and the input signal line 18, respectively. Then, the product term lines 5 has a product signal T3 of a high level when the input signal B has the high level regardless of the input signal A and the product term line 6 has a product signal T4 of a high level when the input signal A has the low level regardless of the input signal B.

The OR array 2 supplies output signal lines 29 and 30 with output signals Q1 and Q2 each having high or low level. Namely, the output signal lines 29 and 30 are coupled in parallel to the source of positive voltage level 20 through p-channel MOS field effect transistors 31 and 32, respectively. The MOS field effect transistors 13 and 14 of the OR array have respective source-drain paths between the output signal line 29 and the ground terminal and respective gate electrodes coupled to the product term lines 3 and 4, respectively. The MOS field effect transistors 13 and 14 thus arranged cause the output line 29 to have the output signal Q1 of the high level only when both of the product signals T1 and T2 on the product term lines 3 and 4 have the respective low levels. Similarly, the MOS field effect transistors 15, 16 and 17 have respective source-drain paths coupled between the output signal line 30 and the ground terminal and respective gate electrodes coupled to the product term lines 4, 5 and 6, respectively. The output signal line 30 thus arranged has the output signal Q2 of the high level only when all of the product signals T2, T3 and T4 on the product term lines 4, 5 and 6 have the respective low levels. The prior-art programmable logic array illustrated in FIG. 1 is operative to produce the output signals Q1 and Q2 represented by the following boolean equations (1) and (2), respectively.

$$Q1 = T1 + T2 = AB + \overline{A}\overline{B} \qquad \text{(Eq. 1)}$$

$$Q2 = T2 + T3 + T4 = AB + B + \overline{A} \qquad \text{(Eq. 2)}$$

Turning to FIG. 3 of the drawings, there is shown the arrangement of the AND array 1 of the programmable logic array illustrated in FIGS. 1 and 2. In FIG. 3, the product term lines 3, 4, 5 and 6 are formed on an intermediate insulating layer overlying a silicon substrate and the input signal lines 18 and 19 and the complementary signal lines 25 and 26 extend over the product term lines 3 to 6 in respective directions substantially perpendicular to the product term lines 3 to 6. The reference numerals 41 to 48 designate n-type diffused regions in a surface portion of the silicon substrate and reference numerals 49 to 64 designate gate electrodes of aluminum. The product term lines 3 and 4 are coupled to the respective side portions of the n-type diffused regions 41, 43, 45 and 47 and the product term lines 5 and 6 are similarly coupled to the respective side portions of the n-type diffused regions 42, 44, 46 and 48. The aluminum gate electrode 49 is coupled to the input signal line 18 through a contact window 65 and an intermediate portion of the n-type diffused regions 41 is electrically coupled to the ground terminal so that the positive charges supplied from the source of positive voltage 20 is discharged to the ground terminal through a left side portion and the intermediate portion of the n-type diffused region 41 when the input signal of the high level is applied from the input signal line 18 to the gate electrode 49 through the contact window 65. Thus, the intermediate portion, the left side portion and the gate electrode 49 forms in combination the MOS type field effect transistor 7 illustrated in FIG. 1. On the other hand, gate electrode 50 is not connected to the input signal line 18 because of lack of a contact window therebetween. This means that the MOS type field effect transistor formed between the input signal line 18 and the product term line 4 does not operate even if the gate electrode 50 is formed. In a similar manner, the MOS type field effect transistor formed between the input signal line 18 and the product term line 5 have no influence on the function of the AND array 1 but the MOS type field effect transistor 8 is provided between the input signal line 18 and the product term line 6. In connection with the inverse signal line 25, the MOS type field effect transistor 9 is formed by an intermediate portion and a right side portion of the n-type diffused region 43 and the gate electrode 54 coupled thereto through a contact window. Further, the MOS type field effect transistor 10 is provided between the input signal line 19 and the product term line 3 because the gate electrode 57 is connected to the input signal line 19 through a contact window but the other MOS type field effect transistors have no influence on the function of the AND array 1. On the other hand, the MOS type field effect transistors 11 and 12 are provided between the complementary signal line 26 and the product term lines 4 and 5, respectively, but another MOS type field effect transistor has no influence on the boolean function. In this manner, the programmable logic array circuit illustrated in FIGS. 1 to 3 realizes the boolean function which is determined by formation of the contact windows during the fabrication process. The AND array 1 illustrated in FIG. 3 is shown in a simple form in FIG. 4 of the drawings. In FIG. 4, the MOS type field effect transistors connected to the signal line 18, 19, 25 or 26 have a circle drawn by a real line but each of the MOS type field effect transistors without connection have a circuit drawn by a broken line.

However, a problem is encountered in the prior-art programmable logic array circuit illustrated in FIGS. 1 to 3 in that the prior-art programmable logic array circuit occupies a large space, which is wasteful of the real estate of the silicon substrate. This is because of the fact that the prior-art programmable logic array circuit needs a large number of MOS type field effect transistors NQ calculated by the following equation (3) whether or not each of the MOS type field effect transistors are used for realizing the predetermined boolean function $$NQ = 2 \times NI \times NP \qquad \text{(Eq. 3)}$$

where NI is the number of the input signal and NP is the number of the product term lines.

SUMMARY OF THE INVENTION

It is therefore an important object of the present invention to provide a programmable logic array circuit which occupies a reduced area on a substrate.

To accomplish these objects, the present invention proposes to selectively connect a gate electrode of a field effect transistor to either of the input signal line and the complementary signal line.

In accordance with one aspect of the present invention, there is provided a programmable logic array fabricated on a semiconductor substrate comprising (a) a plurality of true signal lines arranged in rows and extending over the semiconductor substrate, the true signal lines being electrically isolated from the semiconductor substrate by an insulating film, (b) a plurality of complementary signal lines each intervening between adjacent two of the true signal lines and electrically isolated from the true signal lines and the semiconductor substrate by said insulating film, (c) a plurality of product term lines arranged in columns and extending over the semiconductor substrate, the product term lines being electrically isolated from the semiconductor substrate, the true signal lines and the complementary signal lines by said insulating film, (d) a first source of constant voltage supplying a first constant voltage level to the product term lines, (e) a second source of constant voltage producing a second constant voltage level different from the first constant voltage level, (f) a plurality of active device areas each located under that area defined by one of the true signal lines, one of the complementary signal lines adjacent to aforesaid one of the true signal lines and adjacent two of the product term lines and having two field effect transistors one of which has source/drain regions provided between the second source of constant voltage and one of the adjacent two product term lines defining the active device area and the other of which has source/drain regions provided between the second source of constant voltage and the other of the adjacent two product term lines defining the active device area, and (g) a plurality of gate electrodes each forming a part of one of the field effect transistors and capable of being electrically connected to either of the true signal line and the complementary signal line.

In accordance with another aspect of the present invention, there is provided a programmable logic array circuit fabricated on a semiconductor substrate comprising, (a) plural pairs of true and complementary signal lines arranged in rows and extending over the semiconductor substrate, each pair of the true and complementary signal lines being adjacent to each other, the true signal lines and the complementary signal lines being electrically isolated from the semiconductor substrate by an insulating film, (b) a plurality of product term lines arranged in columns and extending over the semiconductor substrate, the product term lines being electrically isolated from the semiconductor substrate, the true signal lines and the complementary signal lines by the insulating film, (c) a first source of constant voltage supplying a first constant voltage level to the product term lines, (d) a second source of constant voltage producing a second constant voltage level different from the first constant voltage level, (e) a plurality of active device areas each located under that area defined by one of the true signal lines, one of the complementary signal lines adjacent to aforesaid one of the true signal lines and adjacent two of the product term lines and having two field effect transistors one of which has source/drain regions provided between the second source of constant voltage and one of the adjacent two product term lines defining the active device area and the other of which has source/drain regions provided between the second source of constant voltage and the other of the adjacent two product term lines defining the active device area, and (f) a plurality of gate electrodes each forming a part of one of the field effect transistors and capable of being electrically connected to either of the true signal line and the complementary signal line.

Either of the true signal line and the complementary signal line may have a lug portion connected to the gate electrode through a contact window formed in the insulating film. The true signal lines, the complementary signal lines, product term lines, the first source of constant voltage, the second source of constant voltage and the field effect transistors may form in combination an AND array, and the programmable logic array may further comprise an OR array.

BRIEF DESCRIPTION OF THE DRAWINGS

The features and advantages of a programmable logic array circuit according to the present invention will be more clearly understood from the following description taken in conjunction with the accompanying drawings in which.

DESCRIPTION OF THE PREFERRED EMBODIMENTS

First Embodiment

Figure 5:
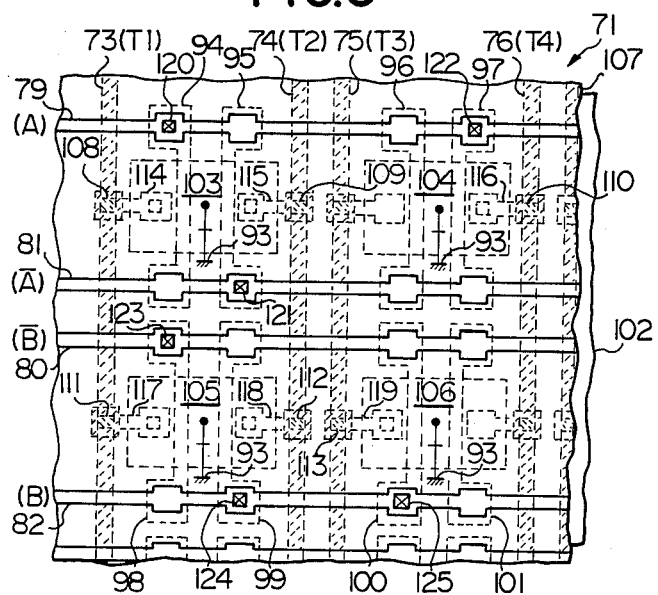
FIG. 5 is a plan view showing the arrangement of an AND array forming part of a programmable logic array circuit embodying the present invention.
Figure 6:
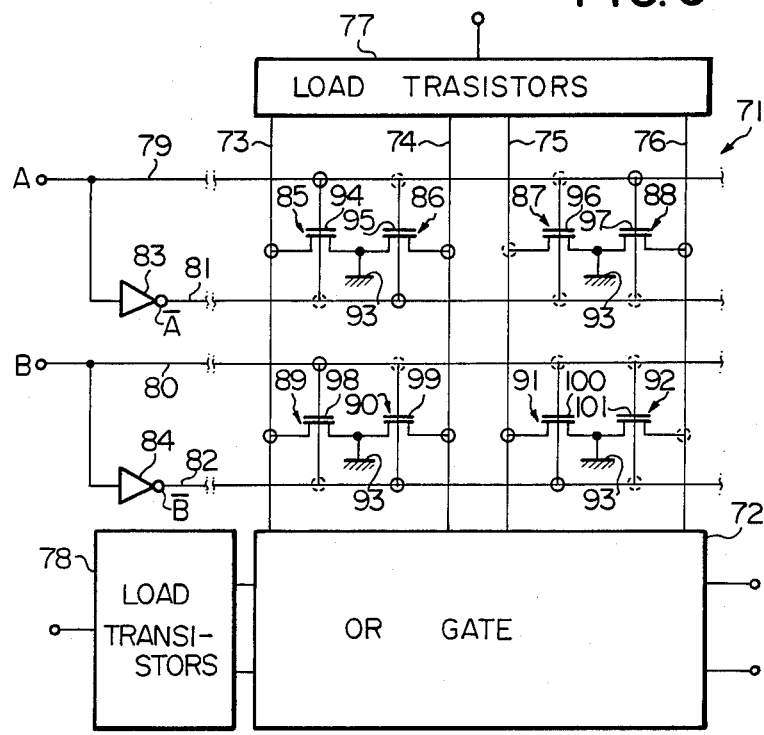
FIG. 6 is a diagram showing the circuit arrangement of the programmable logic array circuit having the AND array illustrated in FIG. 5.

Referring to FIGS. 5 and 6 of the drawings, the arrangement of a programmable logic array circuit embodying the present invention comprises an AND array 71, an OR array 72, product term lines 73, 74, 75 and 76 interconnecting the AND array 71 and the OR array 72, first load transistors 77 and second load transistors 78. The OR array 72, the first load transistors 77 and the second load transistors 78 are similar in construction to the corresponding OR array 2, the load transistors 21 to 24 and the load transistors 31 and 32 so that detailed description will be omitted for the sake of simplicity.

The AND array 71 comprises true signal lines or input signal lines 79 and 80 where input signals A and B are appear, respectively, complementary signal lines 81 and 82 to which the inverses of the input signals are supplied from inverter circuits 83 and 84, respectively, and n-channel type MOS field effect transistors 85, 86, 87, 88, 89, 90, 91 and 92. The MOS field effect transistors 85 to 88 have respective source and drain regions provided between the product term lines 73 to 76 and a ground terminal 93, respectively, and respective gate electrodes 94, 95, 96 and 97 capable of connection to either input signal line 79 or the complementary signal line 81. In a similar manner, the MOS type field effect transistors 89 to 92 have respective source and drain regions provided between the product term lines 73 to 76 and the ground terminal 93 and respective gate electrodes 98, 99, 100 and 101 capable of being connected to either of the input signal line 80 and the complementary signal line 82. The selection between the input signal line 79 or 80 and the complementary signal line 81 or 82 depends on a boolean function which is realized by the programmable logic array circuit and the connections are determined during a step of forming contact windows which will be described hereinunder in detail.

Figure 1:
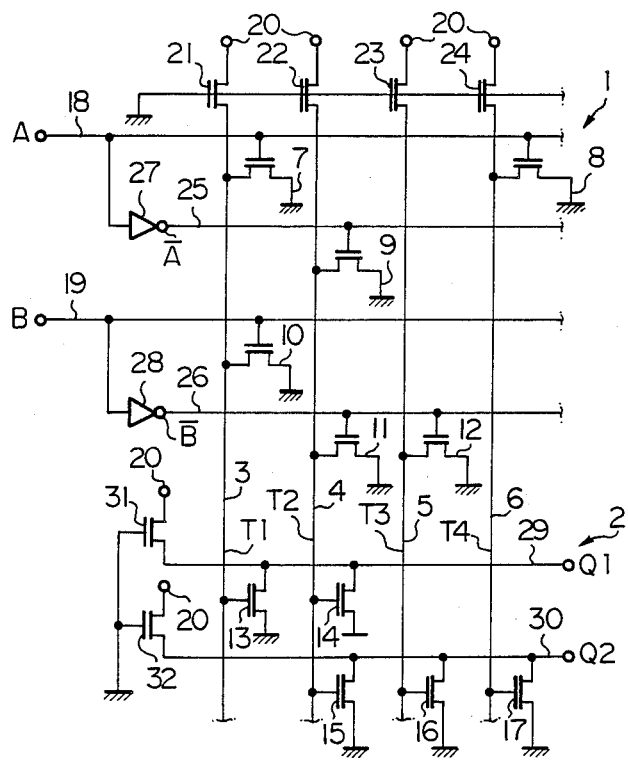
FIG. 1 is a diagram showing the circuit arrangement of a typical example of a prior-art programmable logic array circuit.
Figure 2:
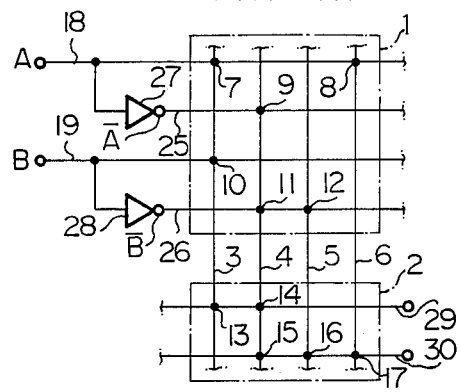
FIG. 2 is a diagram showing, in a simple form, the circuit arrangement of the prior-art programmable logic array circuit illustrated in FIG. 1.
Figure 3:
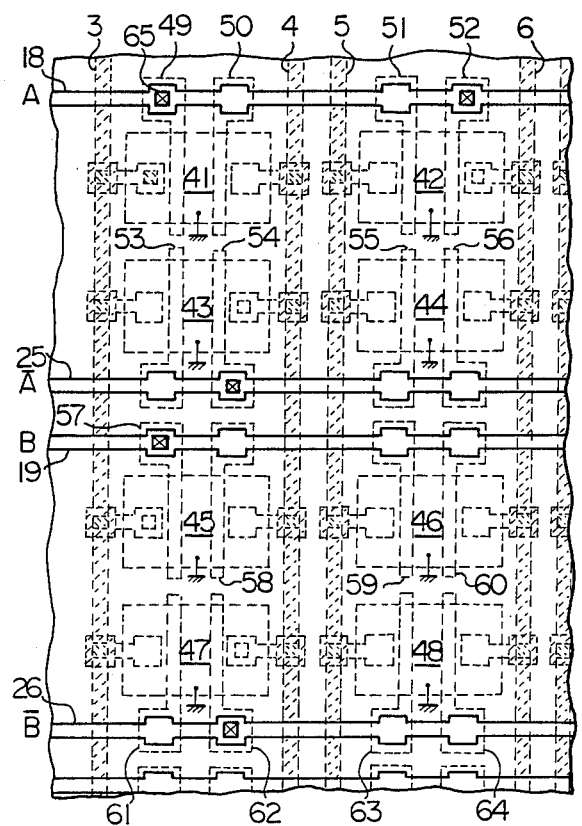
FIG. 3 is a plan view showing the arrangement of the AND array of the programmable logic array circuit illustrated in FIG. 1.
Figure 4:
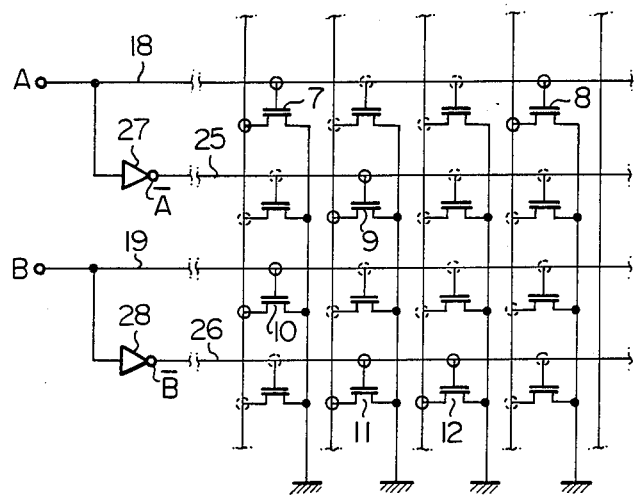
FIG. 4 i a diagram showing, in a simple form, the connections of the AND array illustrated in FIG. 3.

As will be seen from FIG. 1 of the drawings, the AND array 71 of the programmable logic array circuit is fabricated on a silicon substrate 102 and the silicon substrate 102 provides a plurality of n-type impurity regions 103, 104, 105 and 106 arranged in rows and columns. Each of the n-type impurity regions 103 to 106 forms part of an active device region and a central portion thereof is coupled to the ground terminal 93. Over the central portion of each n-type impurity region 103, 104, 105 or 106 are located a pair of polysilicon gate electrode 94 and 95, 96 and 97, 98 and 99 or 100 and 101 which are electrically isolated from the n-type impurity region 103, 104, 105 or 106 by a thin gate insulating film (not shown). The gate electrodes 94 and 95 extend across the n-type impurity region 103 and reach those areas under the input signal line 79 and the complementary signal line 81 and, similarly, the gate electrodes 96 and 97 extend across the n-type impurity region 104 and reach those areas under the input signal line 79 and the complementary signal line 81. On the other hand, the gate electrodes 98 and 99 extend across the n-type impurity region 105 and reach those areas under the input signal line 80 and the complementary signal line 82 and, similarly, the gate electrodes 100 and 101 extend across the n-type impurity region 106 and reach those areas under the input signal line 80 and the complementary signal line 82. All of the gate electrodes 94 to 101 are covered with a thick insulating film 107 and the input signal lines 79 and 80, the complementary signal lines 81 and 82 and the product term lines 73 to 76 are formed in the thick insulating film 107 so as to be isolated from one another.

The thick insulating film 107 provides a plurality of contact windows 108, 109, 110, 111, 112 and 113 and conductive strips 114 and 115 pass through the contact windows 108 and 109 to interconnect the product term lines 73 and 74 and both side portions of the n-type impurity region 103. Similarly, a conductive strip 116 passes through the contact window 110 to interconnect the product term line 76 and the right side portion of the n-type impurity region 104 and conductive strips 117 and 118 pass through the contact windows 111 and 112 to interconnect the product term lines 73 and 74 and both side portions of the n-type impurity regions 105. Left side portion of the n-type impurity region 106 is electrically connected to the product term line 75 through a conductive strip 119 which passes through the contact window 113.

As described hereinbefore, both of the end portions of the gate electrode 94 are located under the input signal line 79 and the complementary signal line 81 but only one contact window 120 is formed under the input signal line 79 so that the a lug portion is formed during forming step of the input signal line 79, thereby interconnecting the input signal line 79 and the gate electrode 94. In a similar manner, the gate electrodes 95 and 97 are coupled to the complementary signal line 81 and the input signal line 79 through contact windows 121 and 122, respectively, and the gate electrodes 98, 99 and 100 are coupled to either of the input signal line 80 and the complementary signal line 82 through contact windows 123, 124 and 125, respectively. The gate electrodes 94, 95, 97, 98, 99 and 100 thus selectively connected to the signal line 79 or 80 or the complementary signal line 81 or 82 allow the MOS type field effect transistors 85, 86, 88, 89, 90 and 91 to operate in accordance with the voltage level of the input signals A and B, however the gate electrodes 96 and 101 are not connected to the input signal line 79 or 80 or the complementary signal line 81 or 82 so that the MOS type field effect transistors 87 and 92 do not operate even if the input signals A and B or the inverse signals thereof are applied to the signal lines 79 to 82.

As will be understood from the foregoing description, the number of the MOS type field effect transistors NQ incorporated in the AND array 71 is given by Equation (4)

$$NQ = NI \times NP$$

where NI is the number of the input signal lines and NP is the number of the product lines. Then, the occupation area of the AND array 71 is reduced in comparison with that of the prior-art AND array 1. In other words, each of the n-type impurity regions 103 to 106 is expected to provide the source and drain regions for only two MOS type field effect transistors but the impurity region of the prior-art AND array 1 should provide the source and drain regions for four field effect transistors. The difference therebetween results in reduction in occupation area of the AND array.

In this instance, each of the complementary signal lines intervenes between two of the adjacent input signal lines, however each of the complementary signal lines may be paired with each of the input signal lines and arranged in such a manner that each complementary signal line neighbours the corresponding input signal line and that each input signal line neighbours the corresponding complementary signal line.

Second Embodiment

Figure 7:
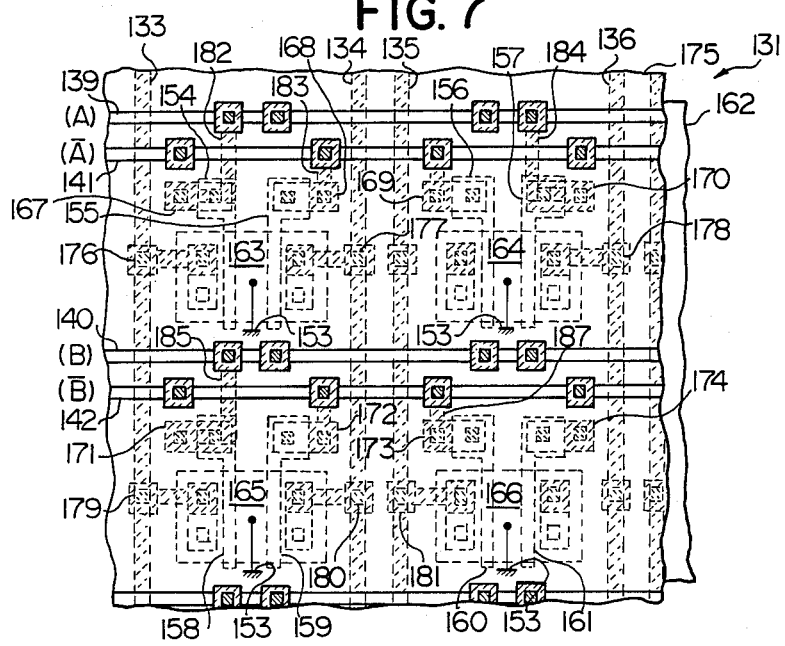
FIG. 7 is a plan view showing another arrangement of an AND array incorporated in a programmable logic array circuit embodying the present invention.
Figure 8:
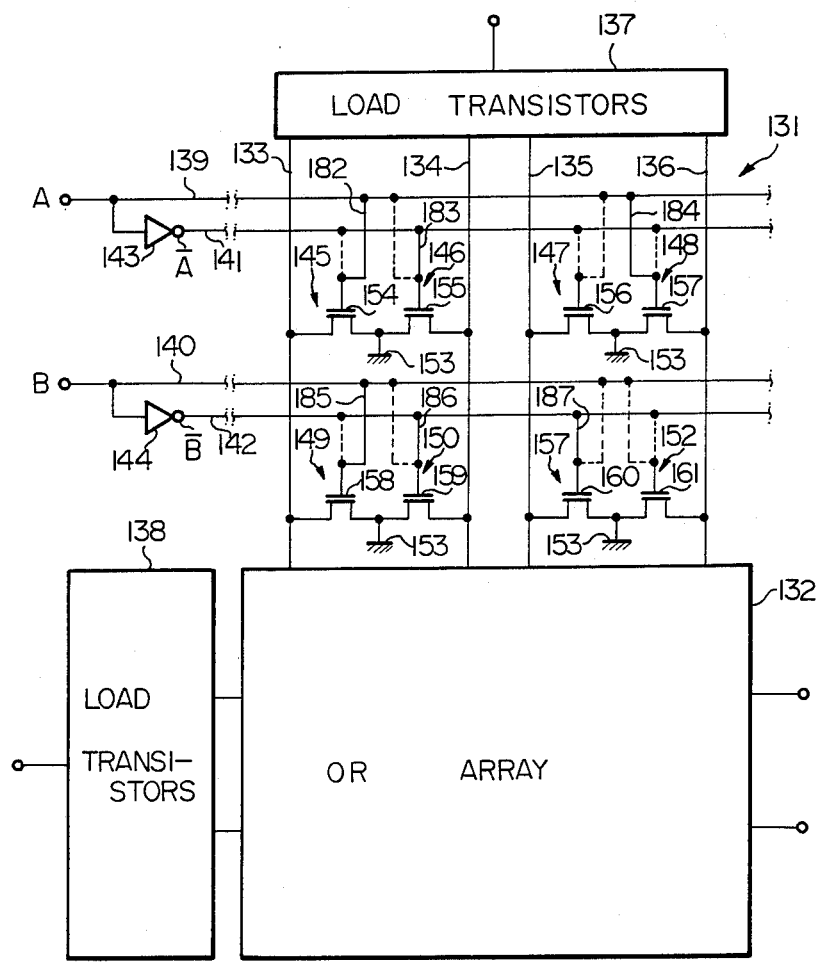
FIG. 8 is a diagram showing the circuit arrangement of the programmable logic array circuit having the AND array illustrated in FIG. 7.

Turning to FIGS. 7 and 8 of the drawings, another arrangement of a programmable logic array circuit embodying the present invention is illustrated. The programmable logic array illustrated in FIGS. 7 and 8 comprises an AND array 131, an OR array 132, product term lines 133, 134, 135 and 136 interconnecting the AND array 131 and the OR array 132, first load transistors 137 and second load transistors 138. The OR array 132, the first load transistors 137 and the second load transistors 138 are similar in construction to the corresponding OR array 2, the load transistors 21 to 24 and the load transistors 31 and 32 so that detailed description will be omitted for the sake of simplicity.

The AND array 131 comprises input signal lines 139 and 140 where input signals A and B are appear, respectively, complementary signal lines 141 and 142 to which the inverses of the input signals are supplied from inverter circuits 143 and 144, respectively, and n-channel type MOS field effect transistors 145, 146, 147, 148, 149, 150, 151 and 152. The MOS type field effect transistors 145 to 148 have respective source and drain regions provided between the product term lines 133 to 136 and a ground terminal 153, respectively, and respective gate electrodes 154, 155, 156 and 157 capable of connection to either input signal line 139 or the complementary signal line 141. In a similar manner, the MOS type field effect transistors 149 to 152 have respective source and drain regions provided between the product term lines 133 to 136 and the ground terminal 153 and respective gate electrodes 158, 159, 160 and 161 capable of being connected to either input signal line 140 or the complementary signal line 142. The selection between the input signal line 139 or 140 and the complementary signal line 141 or 142 depends on a boolean function which is realized by the programmable logic array circuit and the connections are determined during a step of forming contact windows which will be described hereinunder in detail.

As will be best seen from FIG. 7 of the drawings, the AND array 131 of the programmable logic array circuit is fabricated on a silicon substrate 162 and the silicon substrate 162 provides a plurality of n-type impurity regions 163, 164, 165 and 166 arranged in rows and columns. Each of the n-type impurity regions 163 to 166 forms part of an active device region and a central portion thereof is coupled to the ground terminal 153. Over the central portion of each n-type impurity region 163, 164, 165 or 166 are located a pair of polysilicon gate electrodes 154 and 155, 156 and 157, 158 and 159 or 160 and 161 which are electrically isolated from the n-type impurity region 163, 164, 165 or 166 by a thin gate insulating film (not shown). The gate electrodes 154 and 155 extend across the n-type impurity region 163 and are connected to intermediate conductive strips 167 and 168, respectively, which are selectively coupled to the input signal line 139 or the complementary signal line 141, and, similarly, the gate electrodes 156 and 157 extend across the n-type impurity region 164 and is connected to intermediate conductive strips 169 and 170, respectively, the former of which is disconnected from the input signal line 139 and the complementary signal line 141 but the latter of which is selectively coupled to the input signal line 139. On the other hand, the gate electrodes 158 and 159 extend across the n-type impurity region 165 and are connected to intermediate conductive strips 171 and 172, respectively, and, similarly, the gate electrodes 160 and 161 extend across the n-type impurity region 166 and are connected to intermediate conductive strips 173 and 174, respectively. Those intermediate conductive strips are selectively coupled to the input signal line 140 or the complementary signal line 142 except for the intermediate conductive strip 174. All of the gate electrodes 154 to 161 are covered with a thick insulating film 175 and the input signal lines 139 and 140, the complementary signal lines 141 and 142 and the product term lines 133 to 136 are formed in the thick insulating film 175 so as to be isolated from one another. The thick insulating film 175 provides a plurality of contact windows 176, 177, 178, 179, 180 and 181 and short conductive strips pass through the contact windows 176 and 181 to interconnect the product term lines 133 to 136 and side portions of the n-type impurity region 163 to 166.

As described hereinbefore, the end portions of the gate electrodes 154 to 161 are connected to the intermediate conductive strips 167 to 174, respectively, so that the boolean function is determined by connecting the intermediate conductive strip 167, 168, 170, 171, 172 and 173 to the input signal line 139 or 140 or the complementary signal line 141 or 142 through upper conductive strips 182, 183, 184, 185, 186 and 187, respectively. The intermediate conductive strips 169 and 174 are not connected to any signal line 139, 140, 141 or 142 so that the MOS type field effect transistors 147 and 152 do not concern the boolean function. The AND array 131 illustrated in FIGS. 7 and 8 is determined by the connection of upper conductive strips 182 to 187 so that the AND array 131 has an additional advantage over the prior-art programmable logic array circuit because the boolean function is determined by later step of the fabrication process.

Although particular embodiment of the present invention have been shown and described, it will be obvious to those skilled in the art that various changes and modifications may be made without departing from the spirit and scope of the present invention. Further, the present invention is not limited by the boolean function realized by the embodiments described hereinbefore.

What is claimed is:

1. A programmable logic array circuit fabricated on a semiconductor substrate comprising:
   (a) plural pairs of true and complementary signal lines arranged in rows and extending over said semiconductor substrate, each pair of said true and complementary signal lines being adjacent to each other, said true signal lines and said complementary signal lines being electrically isolated from the semiconductor substrate by an insulating film;
   (b) a plurality of product term lines arranged in columns and extending over said semiconductor substrate, said product term lines being formed in said insulating film so as to be electrically isolated from said semiconductor substrate, said true signal lines and said complementary signal lines;
   (c) a first source of constant voltage supplying a first constant voltage level through load means to said product term lines;
   (d) a second source of constant voltage producing a second constant voltage level different from said first constant voltage level;
   (e) a plurality of active device areas each located under that area defined by one of said true signal lines, one of said complementary signal lines adjacent to aforesaid one of the true signal lines and adjacent two of said product term lines and having two field effect transistors one of which has source/drain regions provided between said second source of constant voltage and one of the adjacent two product term lines defining the active device area and the other of which has source/drain regions provided between the second source of constant voltage and the other of the adjacent two product term lines defining the active device area;
   (f) a plurality of gate electrodes each forming a part of one of said field effect transistors and covered with said insulating film;
   (g) a plurality of intermediate conductive layers formed in a lower portion of said insulating film and respectively connected to said gate electrode; and
   (h) a plurality of upper conductive layers formed in an upper portion of said insulating film and coupled between intermediate conductive layers selected from said intermediate conductive layers and either of said true signal line and said complementary signal line.

* * * * *

UNITED STATES PATENT AND TRADEMARK OFFICE
CERTIFICATE OF CORRECTION

PATENT NO. : 4,853,562

DATED : August 1, 1989

INVENTOR(S) : Yamada

It is certified that error appears in the above-identified patent and that said Letters Patent is hereby corrected as shown below:

Column 2, lines 18-20, delete "equation 1 and equation 2, and insert --

$$Q1 = \overline{T1} + \overline{T2} = \overline{\overline{A}\overline{B}} + \overline{AB}$$

$$Q2 = \overline{T2} + \overline{T3} + \overline{T4} = \overline{AB + B + \overline{A}} \text{ --;}$$

Signed and Sealed this

Thirty-first Day of July, 1990

*Attest:*

HARRY F. MANBECK, JR.

*Attesting Officer*     *Commissioner of Patents and Trademarks*